United States Patent
Kim et al.

(10) Patent No.: US 11,703,706 B2
(45) Date of Patent: Jul. 18, 2023

(54) OPTICAL FILTER COMPRISING A FIRST CAPPING LAYER BETWEEN A LOW REFRACTIVE INDEX LAYER AND A LIGHT-CONVERTING LAYER HAVING LIGHT-CONVERTING PORTIONS RESPECTIVELY CORRESPONDING TO COLOR FILTERS

(71) Applicant: Samsung Display Co., Ltd., Yongin-Si (KR)

(72) Inventors: Jeongki Kim, Yongin-si (KR); Jangil Kim, Yongin-si (KR); Jeaheon Ahn, Yongin-si (KR); Seongyeon Lee, Yongin-si (KR); Taehyung Hwang, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 320 days.

(21) Appl. No.: 16/905,983

(22) Filed: Jun. 19, 2020

(65) Prior Publication Data
US 2021/0109400 A1    Apr. 15, 2021

(30) Foreign Application Priority Data
Oct. 10, 2019  (KR) .................. 10-2019-0125691

(51) Int. Cl.
| G02F 1/1335 | (2006.01) |
| G02F 1/13357 | (2006.01) |
| H01L 33/50 | (2010.01) |
| H01L 33/04 | (2010.01) |

(52) U.S. Cl.
CPC .. *G02F 1/133514* (2013.01); *G02F 1/133603* (2013.01); *G02F 1/133606* (2013.01); *H01L 33/04* (2013.01); *H01L 33/505* (2013.01); *G02F 1/133519* (2021.01); *G02F 1/133607* (2021.01)

(58) Field of Classification Search
CPC ......... G02F 1/133617; G02F 1/133519; G02F 2203/05; G02F 2202/046; G02F 1/01791
See application file for complete search history.

(56) References Cited

U.S. PATENT DOCUMENTS

| 10,241,360 | B2 | 3/2019 | Chu et al. | |
| 2018/0059472 | A1* | 3/2018 | Kim | G02B 27/281 |
| 2019/0121176 | A1* | 4/2019 | Lee | G02F 1/133617 |

FOREIGN PATENT DOCUMENTS

| CN | 1678948 A | * | 10/2005 | ........... G02F 1/1334 |
| CN | 1906531 A | * | 1/2007 | ............. B32B 17/10 |
| KR | 10-2017-0124122 A | | 11/2017 | |
| KR | 10-1923608 B1 | | 11/2018 | |

(Continued)

*Primary Examiner* — Paul C Lee
(74) *Attorney, Agent, or Firm* — Innovation Counsel LLP

(57) ABSTRACT

An optical filter includes a substrate, a filter layer on the substrate and including color filters, and a light-converting layer over the filter layer and including light-converting portions respectively corresponding to the color filters. A low refractive index layer is between the filter layer and the light-converting layer and has a refractive index less than a refractive index of the light-converting layer. A first capping layer is between the low refractive index layer and the light-converting layer and has a refractive index ranging between the refractive index of the light-converting layer and the refractive index of the low refractive index layer.

16 Claims, 9 Drawing Sheets

(56) References Cited

FOREIGN PATENT DOCUMENTS

| KR | 10-2019-0047403 A | 5/2019 |
|---|---|---|
| KR | 10-2019-0047592 A | 5/2019 |
| KR | 10-1998311 B1 | 7/2019 |

* cited by examiner

OPTICAL FILTER COMPRISING A FIRST CAPPING LAYER BETWEEN A LOW REFRACTIVE INDEX LAYER AND A LIGHT-CONVERTING LAYER HAVING LIGHT-CONVERTING PORTIONS RESPECTIVELY CORRESPONDING TO COLOR FILTERS

CROSS-REFERENCE TO RELATED APPLICATION

This application claims the benefit of Korean Patent Application No. 10-2019-0125691, filed on Oct. 10, 2019, in the Korean Intellectual Property Office, the disclosure of which is incorporated herein in its entirety by reference.

BACKGROUND

1. Field

One or more embodiments relate to an optical filter and a display device including the same.

2. Description of Related Art

As various kinds of electronic apparatuses such as mobile phones, personal digital assistants (PDA), computers, and large-scale televisions (TV) are developed, various kinds of display devices applicable to the electronic apparatuses are also under development. For example, as display devices widely used in the market, there are liquid crystal display devices including a backlight unit and organic light-emitting display devices that emit light having different colors for each pixel area. Recently, display devices including a quantum dot-color conversion layer (QD-CCL) are under development. A quantum dot is excited by incident light and emits light having a wavelength longer than a wavelength of the incident light. For the incident light, light in a low wavelength band is used.

SUMMARY

One or more embodiments include an optical filter and a display device including the same which has an excellent display quality by having an improved light-emission efficiency and reducing external light reflectivity.

Additional aspects will be set forth in part in the description which follows and, in part, will be apparent from the description, or may be learned by practice of the presented embodiments of the disclosure.

According to one or more embodiments, an optical filter includes a substrate, a filter layer on the substrate and including color filters, a light-converting layer over the filter layer and including light-converting portions respectively corresponding to the color filters, a low refractive index layer between the filter layer and the light-converting layer and having a refractive index less than a refractive index of the light-converting layer, and a first capping layer between the low refractive index layer and the light-converting layer and having a refractive index between the refractive index of the light-converting layer and the refractive index of the low refractive index layer.

The optical filter may further include a buffer layer covering the filter layer between the filter layer and the low refractive index layer.

The optical filter may further include a second capping layer between the filter layer and the low refractive index layer, wherein a refractive index of the second capping layer may be less than a refractive index of the filter layer and greater than the refractive index of the low refractive index layer.

The optical filter may further include a buffer layer covering the filter layer between the filter layer and the second capping layer.

The optical filter may further include pixel areas apart from each other and a light-blocking area between the pixel areas, wherein the color filters may correspond to the pixel areas, and two neighboring color filters among the color filters may partially overlap each other in the light-blocking area.

A first light-blocking pattern may be located in the light-blocking area, and one of the color filters may be located between the first light-blocking pattern and the substrate.

The light-converting portions may include a first light-converting portion, a second light-converting portion, and a third light-converting portion each including scattering particles, the first light-converting portion including first quantum dots, and the third light-converting portion including third quantum dots, and the first quantum dots and the third quantum dots may include a same material and have different sizes.

The optical filter may further include a barrier layer covering the light-converting portions, wherein the light-converting portions are apart from each other, and the barrier layer may directly contact the first capping layer in the light-blocking area.

The optical filter may further include a second light-blocking pattern located between the light-converting portions that are apart from each other.

The optical filter may further include an overcoat layer providing a flat surface by covering the light-converting portions.

According to one or more embodiments, a display device includes a light-emitting panel that emits incident light having a single color, and an optical filter including pixel areas and a light-blocking area between the pixel areas and converting the incident light into converted light having different colors to emit the converted light from the pixel areas to the outside. The optical filter may include a substrate, a filter layer on the substrate and including color filters, a light-converting layer over the filter layer and including light-converting portions respectively corresponding to the color filters, a low refractive index layer between the filter layer and the light-converting layer, and a first capping layer between the low refractive index layer and the light-converting layer. A refractive index of the first capping layer may be greater than a refractive index of the low refractive index layer and less than a refractive index of the light-converting layer.

The light-emitting panel may include light-emitting elements that generate the incident light having the single color, and the light-emitting elements may respectively correspond to the pixel areas.

The display device may further include a buffer layer covering the filter layer between the filter layer and the low refractive index layer.

The display device may further include a second capping layer between the filter layer and the low refractive index layer, wherein a refractive index of the second capping layer may be less than a refractive index of the filter layer and greater than a refractive index of the low refractive index layer.

The display device may further include a buffer layer covering the filter layer between the filter layer and the second capping layer.

The color filters may correspond to the pixel areas, and two neighboring color filters among the color filters may partially overlap each other in the light-blocking area.

A first light-blocking pattern may be located in the light-blocking area, and one of the color filters may be located between the first light-blocking pattern and the substrate.

The display device may further include a barrier layer covering the light-converting portions, wherein the light-converting portions are apart from each other, and the barrier layer may directly contact the first capping layer in the light-blocking area.

The display device may further include a second light-blocking pattern located between the light-converting portions that are apart from each other.

The light-emitting panel may include a liquid crystal layer including liquid crystal molecules, the optical filter may further include an overcoat layer providing a flat surface by covering the light-converting portions, and the display device may further include a polarization layer between the light-emitting panel and the overcoat layer.

BRIEF DESCRIPTION OF THE DRAWINGS

The above and other aspects, features, and advantages of certain embodiments of the disclosure will be more apparent from the following description taken in conjunction with the accompanying drawings.

DETAILED DESCRIPTION

Figure 1:
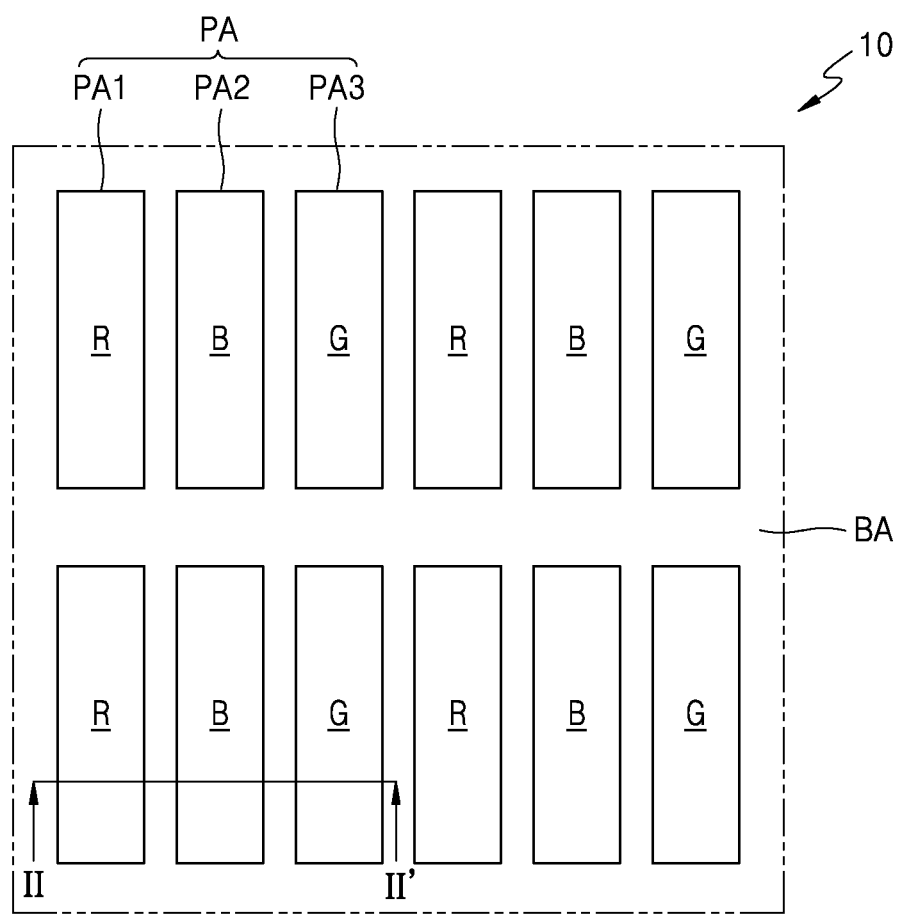
FIG. 1 is a plan view of a portion of a display device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, and other variations.

It will be understood that although the terms "first," "second," etc. may be used herein to describe various components, these components should not be limited by these terms. These components are only used to distinguish one component from another.

As used herein, the singular forms "a," "an," and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on," another layer, region, or component, it can be directly or indirectly formed on the other layer, region, or component. That is, for example, intervening layers, regions, or components may be present.

Sizes of elements in the drawings may be exaggerated for convenience of explanation. In other words, sizes and thicknesses of components in the drawings are arbitrarily illustrated for convenience of explanation.

Hereinafter, the present embodiments are described in detail with reference to the accompanying drawings. In the drawings, the same reference numerals are given to the same or corresponding elements.

FIG. 1 is a plan view of a portion of a display device 10 according to an embodiment.

Referring to FIG. 1, the display device 10 according to an embodiment may include a pixel area PA that emits light, and a light-blocking area BA. The light-blocking area BA is an area that blocks light emitted from the display device 10.

The pixel area PA may be divided into a first pixel area PA1, a second pixel area PA2, and a third pixel area PA3 depending on a color of emitted light. For example, the first pixel area PA1 may emit red light R having a peak wavelength equal to 580 nm or more and less than 750 nm, the second pixel area PA2 may emit blue light B having a peak wavelength equal to 400 nm or more and less than 495 nm, and the third pixel area PA3 may emit green light having a peak wavelength equal to 495 nm or more and less than 580 nm.

The first pixel area PA1, the second pixel area PA2, and the third pixel area PA3 may be apart from one another, and the light-blocking area BA may be located between the first to third pixel areas PA1, PA2, and PA3. For example, as shown in FIG. 1, the light-blocking area BA may have a mesh shape surrounding the first pixel area PA1, the second pixel area PA2, and the third pixel area PA3. However, the configuration of the first pixel area PA1, the second pixel area PA2, and the third pixel area PA3 is provided as an example, and the first pixel area PA1, the second pixel area PA2, and the third pixel area PA3 may be variously arranged with various shapes. Also, the pixel area PA may further include a fourth pixel area that emits white light.

Figure 2:
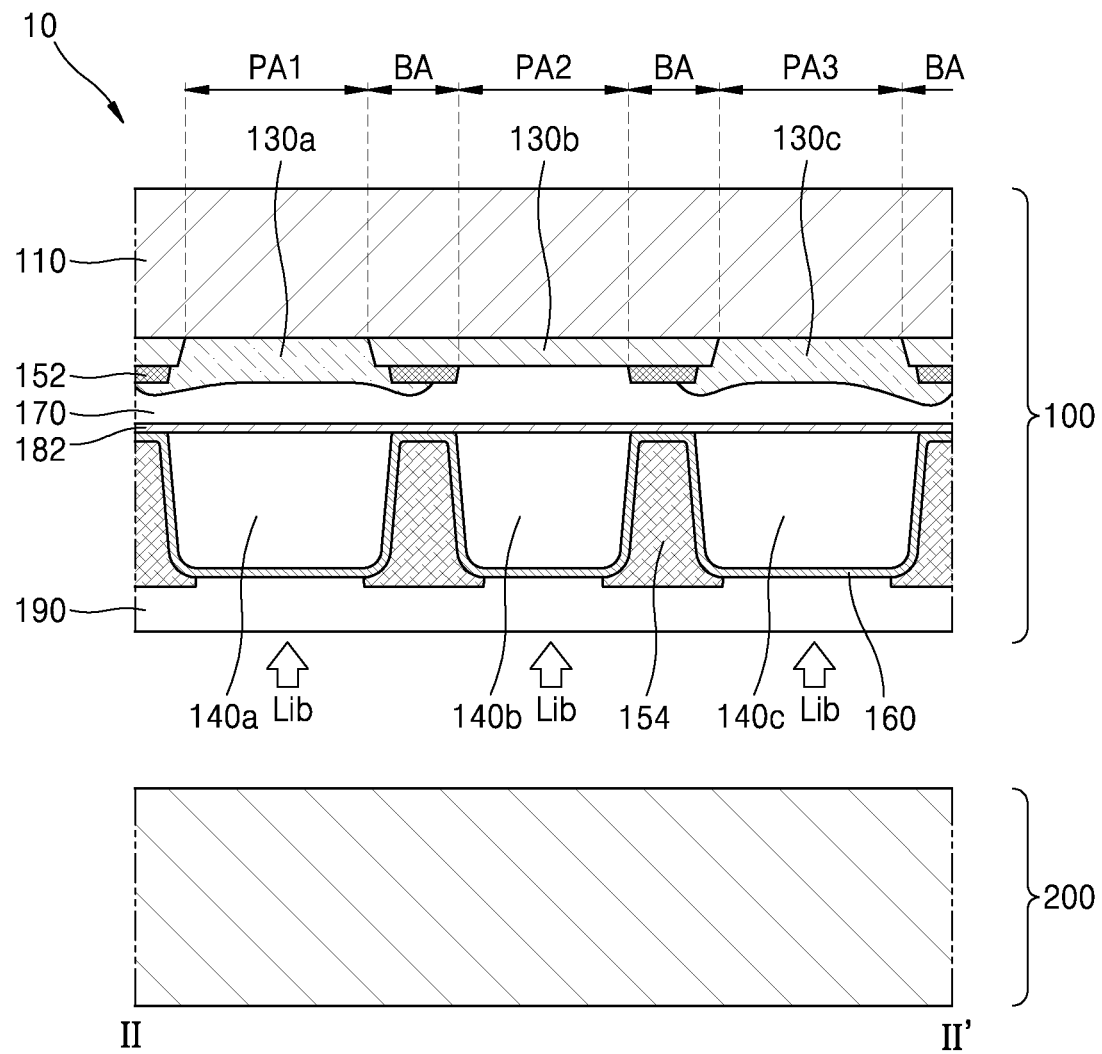
FIG. 2 is a cross-sectional view of an example of the display device, taken along line II-II' of FIG. 1.
Figure 3:
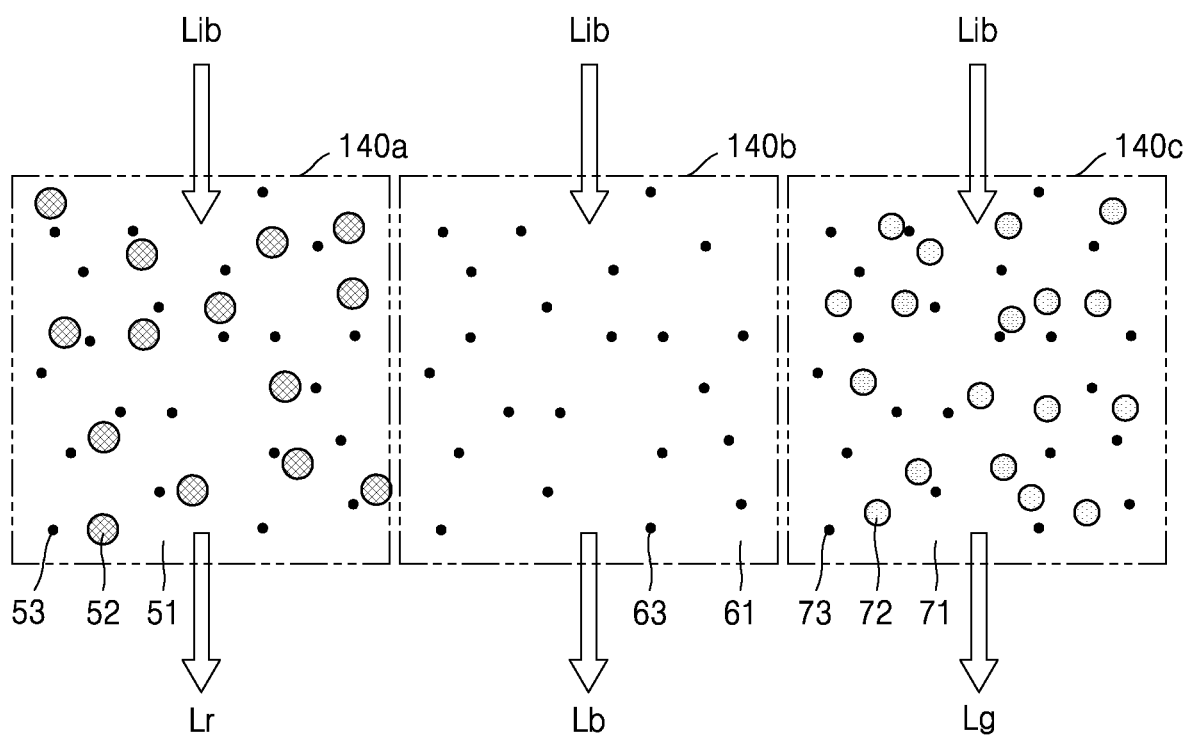
FIG. 3 is an enlarged cross-sectional view of first to third light-converting layer of FIG. 2.
Figure 4:
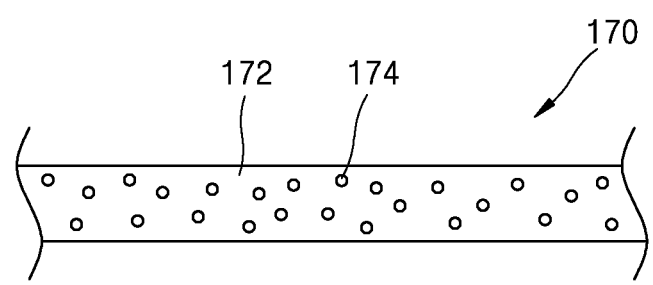
FIG. 4 is a cross-sectional view of an example of a low refractive index layer of FIG. 2.
Figure 5:
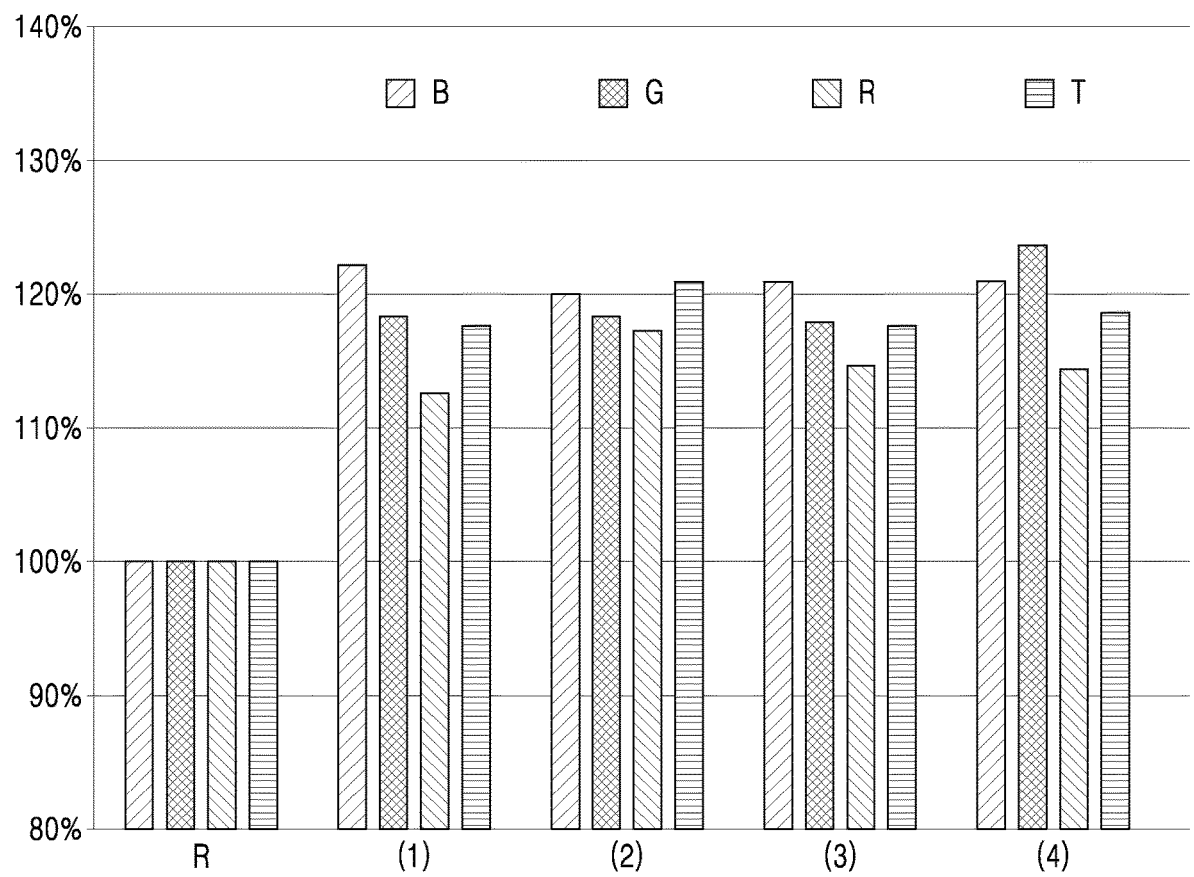
FIG. 5 is a graph showing efficiency improvement of the display device of FIG. 1.

FIG. 2 is a cross-sectional view of an example of the display device, taken along line II-II' of FIG. 1. FIG. 3 is an enlarged cross-sectional view of first to third light-converting portions 140a, 140b, and 140c of FIG. 2. FIG. 4 is a cross-sectional view of an example of a low refractive index layer 170 of FIG. 2. FIG. 5 is a graph showing efficiency improvement of the display device 10 of FIG. 1.

As shown in FIG. 2, the display device 10 according to an embodiment may include a light-emitting panel 200 and an optical filter 100 stacked over the light-emitting panel 200. The optical filter 100 may be directly attached to the light-emitting panel 200 by using a transparent adhesive layer. As another example, a filling layer including a transparent insulating layer or an air layer may be further arranged between the optical filter 100 and the light-emitting panel 200.

The light-emitting panel 200 may generate incident light Lib that is incident to the optical filter 100, and the optical filter 100 may receive the incident light Lib generated from the light-emitting panel 200 and convert the incident light Lib into light having different colors and emit the converted light. For example, the incident light Lib may include blue light, and light emitted from the light-emitting panel 200 may include red light, blue light, and green light.

The optical filter 100 may include a substrate 110, a filter layer 130, a light-converting layer 140, the low refractive index layer 170, and a first capping layer 182. The filter layer 130 is arranged on a first surface of the substrate 110. The light-converting layer 140 is arranged over the filter layer 130. The low refractive index layer 170 is between the filter layer 130 and the light-converting layer 140. The first capping layer 182 is between the low refractive index layer 170 and the light-converting layer 140. Here, the first surface of the substrate 110 is a surface facing the light-emitting panel 200. Also, the optical filter 100 may include a first light-blocking pattern 152 and a second light-blocking pattern 154 at locations overlapping the light-blocking areas BA.

The substrate 110 has a light transmission characteristic and may include an insulating material, for example, glass, plastic, and crystal. A material of the substrate 110 may be selected by taking into account mechanical strength, thermal stability, transparency, surface flatness, ease of handling, waterproof, etc. For example, in the case where the substrate 110 includes a polymer material, the substrate 110 may include at least one of polycarbonate (PC), polyethylene terephthalate (PET), polyethylene (PE), polypropylene (PP), polysulfone (PSF), polymethylmethacrylate (PMMA), tri-acetyl cellulose (TAC), cyclo-olefin polymer (COP), and cyclo-olefin copolymer (COC).

The filter layer 130 located on the first surface of the substrate 110 may include an organic material pattern including dye or pigment. The filter layer 130 may include a first color filter 130a, a second color filter 130b, and a third color filter 130c. The first color filter 130a is arranged in the first pixel area PA1, the second color filter 130b is arranged in the second pixel area PA2, and the third color filter 130c is arranged in the third pixel area PA3.

The first color filter 130a may include pigment or dye of a first color, e.g. red, to selectively transmit only light of the first color. The second color filter 130b may include pigment or dye of a second color, e.g. blue, to selectively transmit only light of the second color. The third color filter 130c may include pigment or dye of a third color, e.g. green, to selectively transmit only light of the third color.

In the light-blocking area BA, the first light-blocking pattern 152 may be arranged over the first surface of the substrate 110. The first light-blocking pattern 152 may include an opaque inorganic insulating material such as chrome oxide or molybdenum oxide or an opaque organic insulating material such as a black resin. The first light-blocking pattern 152 may block light emitted to the outside through the light-blocking area BA, thereby preventing light leakage from occurring in the display device 10.

One of the first to third color filters 130a, 130b, and 130c may be arranged between the first light-blocking pattern 152 and the substrate 110. For example, FIG. 2 shows an example in which the first light-blocking pattern 152 is arranged on the second color filter 130b, wherein a portion of edges of the first color filter 130a and the third color filter 130c is located on the first light-blocking pattern 152.

For this, the second filter color 130b is provided on the first surface of the substrate 110. In this case, the second color filter 130b is not provided on locations corresponding to the first pixel area PA1 and the third pixel area PA3. Subsequently, the first light-blocking pattern 152 is formed on the second color filter 130b and are not formed on locations corresponding to the first pixel area PA1, the second pixel area PA2, and the third pixel area PA3. Therefore, the light-blocking area BA and the first to third pixel areas PA1, PA2, and PA3 may be defined by forming the first light-blocking pattern 152. The first color filter 130a may be formed in the first pixel area PA1, and the third color filter 130c may be formed in the third pixel area PA3.

The first to third color filters 130a, 130b, and 130c may extend to the light-blocking areas BA between the first to third pixel areas PA1, PA2, and PA3 and partially overlap the adjacent color filter. That is, the first to third color filters 130a, 130b, and 130c may be formed larger than the first to third pixel areas PA1, PA2, and PA3. Therefore, even though an error occurs in the formation location while the first to third color filters 130a, 130b, and 130c are formed, a defect does not occur in the optical filter 100 and thus the efficiency of manufacturing the optical filter 100 may be improved.

The light-converting layer 140 is located over the filter layer 130. The light-converting layer 140 may include the first to third light-converting portions 140a, 140b, and 140c, sometimes called the first to third light-converting layers 140a, 140b, and 140c. The first to third light-converting portions 140a, 140b, and 140c may respectively correspond to the first to third color filters 130a, 130b, and 130c. The first to third light-converting portions 140a, 140b, and 140c convert the incident light Lib generated from the light-emitting panel 200 into light having a specific color and emit the converted light toward the substrate 110.

For example, as shown in FIG. 3, the first light-converting portion 140a may convert blue incident light Lib into light Lr having a first color. The light Lr having the first color may include red light. For this, the first light-converting portion 140a may include a first photosensitive polymer 51 in which first quantum dots 52 are dispersed.

The first photosensitive polymer 51 may include an organic material having a light transmission characteristic such as a silicon resin and an epoxy resin.

The first quantum dots 52 may be excited by the blue incident light Lib to emit the light Lr of the first color isotropically, the light Lr having a wavelength longer than a wavelength of the blue light. The first quantum dots 52 may include a Groups II-VI compound, a Groups III-V compound, a Groups IV-VI compound, a Group IV compound, or a combination of the compounds.

First scattering particles 53 may be further dispersed inside the first photosensitive polymer 51. The first scattering particles 53 may scatter the blue incident light Lib that is not absorbed by the first quantum dots 52 and allow more first quantum dots 52 to be excited, thereby increasing a color conversion efficiency of the first light-converting portion 140a. The first scattering particles 53 may be, for example, titanium oxide ($TiO_2$) or metal particles.

The second light-converting portion 140b may include a second photosensitive polymer 61 in which second scattering particles 63 are dispersed. That is, the second light-converting portion 140b does not include a separate quantum dot that may be excited by the blue incident light Lib. Like the first photosensitive polymer 51, the second photosensitive polymer 61 may include an organic material having a light transmission characteristic, and the second scattering particle 63 may include the same material as that of the first scattering particle 53. Therefore, since the blue incident light Lib that is incident to the second light-converting portion 140b may pass through the second light-converting portion 140b without color change, light Lb having a second color emitted through the second light-converting portion 140b may be the blue light. However, the blue incident light Lib may be scattered by the second scattering particles 63 inside the second light-converting portion 140b and emitted toward the substrate 110.

The third light-converting portion 140c converts the blue incident light Lib into light Lg having a third color. The light Lg having the third color may include green light. The third light-converting portion 140c may include a third photosensitive polymer 71 in which third quantum dots 72 are dispersed. Third scattering particles 73 inside the third photosensitive polymer 71 are dispersed with the third quantum dots 72 to increase a color conversion efficiency of the third light-converting portion 140c.

The third photosensitive polymer 71 may include the same material as that of the first photosensitive polymer 51, and the third scattering particles 73 may include the same material as that of the first scattering particles 53. The third quantum dots 72 may include a Groups II-VI compound, a Groups III-V compound, a Groups IV-VI compound, a Group IV compound, or a combination of the compounds. That is, the third quantum dots 72 may include the same material as that of the first quantum dots 52. However, a size of the third quantum dots 72 may be less than a size of the first quantum dots 52. With this configuration, the third quantum dots 72 may be excited by the blue incident light Lib to isotropically emit the light Lg of the third color having a wavelength longer than the wavelength of the blue light and less than the wavelength of the light Lr having the first color.

The first to third light-converting portions 140a, 140b, and 140c may be covered by a barrier layer 160. The barrier layer 160 may be entirely provided on the first surface of the substrate 110 to cover the first to third light-converting portions 140a, 140b, and 140c. The barrier layer 160 may include an inorganic insulating material such as silicon nitride, silicon oxide, or silicon oxynitride and prevent outgassing of the first to third light-converting portions 140a, 140b, and 140c.

The first to third light-converting portions 140a, 140b, and 140c may be apart from each other and the second light-blocking patterns 154 may be arranged between the first to third light-converting portions 140a, 140b, and 140c. Therefore, the occurrence of color mixing between light converted by the first to third light-converting portions 140a, 140b, and 140c that neighbor each other may be prevented.

The second light-blocking pattern 154 may have various colors including black or white. For example, the second light-blocking pattern 154 may have a black color and include a black matrix. The second light-blocking pattern 154 may include an opaque inorganic insulating material such as chrome oxide or molybdenum oxide or an opaque organic insulating material such as a black resin. The second light-blocking pattern 154 may include an organic insulating material such as a white resin.

Also, the second light-blocking pattern 154 may further include a metal particle having excellent reflectivity such as silver (Ag) and aluminum (Al). Therefore, the reflectivity of the second light-blocking pattern 154 increases. The second light-blocking pattern 154 reflects the incident light Lib that does not excite the first quantum dots 52 or the third quantum dots 72, thereby reducing the incident light Lib that is lost without exciting the first quantum dots 52 or the third quantum dots 72. As a result, utilization of the incident light Lib increases and thus a light conversion efficiency of the optical filter 100 may be improved.

The low refractive index layer 170 may be arranged between the filter layer 130 and the light-converting layer 140. The first capping layer 182 may be arranged between the low refractive index layer 170 and the light-converting layer 140.

The low refractive index layer 170 may be formed over the first surface of the substrate 110 on which the first to third color filters 130a, 130b, and 130c are arranged to cover the first to third color filters 130a, 130b, and 130c. As shown in FIG. 4, the low refractive index layer 170 may include an organic material layer 172 and inorganic particles 174 including a cavity and dispersed inside the organic material layer 172.

The organic material layer 172 may include at least one of acryl, polysiloxane, fluorinated-polysiloxane, polyurethane, fluorinated-polyurethane, and polyurethaneacrylate, and the inorganic particle 174 may include silica having a cavity shape.

The low refractive index layer 170 is formed by coating the organic material layer 172 in which the inorganic particles 174 having a cavity are dispersed and may have an average thickness ranging from about 2 μm to about 3 μm such that a surface of the low refractive index layer 170 away from the substrate 110 is a flat surface. Here, the average thickness means an average value of thicknesses of the low refractive index layer 170 measured from the flat surface of the low refractive index layer 170.

The first capping layer 182 may include silicon oxide or silicon oxynitride to protect the low refractive index layer 170, which includes an organic material. Since the first capping layer 182 is arranged on the flat surface of the low refractive index layer 170, the first capping layer 182 may be formed with a uniform thickness. For example, the first capping layer 182 may have a thickness ranging from about 1000 Å to about 4000 Å. Since the first to third light-converting portions 140a, 140b, and 140c are apart from each other, the barrier layer 160 may directly contact the first capping layer 182 in the light-blocking area BA. That is, the first to third light-converting portions 140a, 140b, and 140c each may be capsulated by the barrier layer 160 and the first capping layer 182.

A refractive index of the low refractive index layer 170 may be less than a refractive index of the light-converting layer 140. A refractive index of the first capping layer 182 may have a value between the refractive index of the low refractive index layer 170 and the refractive index of the light-converting layer 140. For example, a refractive index of the first to third light-converting portions 140a, 140b, and 140c may be about 1.5 to about 1.7, and a refractive index of the low refractive index layer 170 may be 1.3 or less. Since the refractive index of the low refractive index layer 170 is less than the refractive index of the first capping layer 182, and the refractive index of the first capping layer 182 is less than the refractive index of the light-converting layer 140, a light-converting efficiency of the optical filter 100 may be improved and excellent light-emission efficiency may be provided.

FIG. 5 shows results obtained by measuring brightness when light having a wavelength of about 457 nm is incident to the optical filter 100. Here, (1) to (4) of FIG. 5 show the cases where the low refractive index layer 170 and the first capping layer 182 are provided between the light-converting layer 140 and the filter layer 130, and the case R of FIG. 5 shows the case where the low refractive index layer 170 and the first capping layer 182 are not provided. In this case, the refractive index of the light-converting layer 140 and the filter layer 130 is about 1.6, and the refractive index of the low refractive index layer 170 is about 1.2, and the first capping layer 182 includes silicon oxide and has a refractive index of about 1.4. Also, (1), (2), (3), and (4) are the cases where thicknesses of the first capping layer 182 are respectively 4000 Å, 2000 Å, 3000 Å, and 1000 Å.

As known in FIG. 5, compared to the case R, the cases (1), (2), (3), and (4) show that brightness of blue light B, green light G, and red light R emitted from the optical filter 100 increased, and as a result, the total brightness T of the display device 10 improved. This is because, since refractive indexes increase in the sequence of the low refractive index layer 170, the first capping layer 182, and the light-converting layer 140, a light conversion efficiency of the light-converting layer 140 is improved and thus the optical filter 100 has an excellent light emission efficiency.

More specifically, the low refractive index layer 170 is arranged between the light-converting layer 140 and the filter layer 130, the low refractive index layer 170 having a refractive index less than the refractive indexes of the light-converting layer 140 and the filter layer 130. Therefore, incident light Lib that does not excite the first quantum dots 52 or the third quantum dots 72 may be totally reflected at an interface between the light-converting layer 140 and the first capping layer 182 or at an interface between the first capping layer 182 and the low refractive index layer 170. With this, utilization of the incident light Lib increases and thus a light conversion efficiency of the light-converting layer 140 may be improved.

Also, since the refractive index of the first capping layer 182 has a value between the refractive index of the low refractive index layer 170 and the refractive index of the light-converting layer 140, a critical angle may be increased compared to the case where the low refractive index layer 170 directly contacts the light-converting layer 140. Therefore, since light that should be emitted through the pixel area PA may be prevented from being totally reflected and only light that obliquely progresses, for example, progresses toward the light-blocking area BA is totally reflected, a light conversion efficiency of the light-converting layer 140 is improved. Accordingly, the optical filter 100 may have an excellent light emission efficiency. Therefore, the brightness of the display device 10 may be improved.

The optical filter 100 may further include an overcoat layer 190 covering the first to third light-converting portions 140a, 140b, and 140c and providing a flat surface facing the light-emitting panel 200. The overcoat layer 190 may include a transparent organic material such as a polyimide resin and an acrylic resin. The overcoat layer 190 may be formed by using a wet process including a slit coating method and a spin coating method, and a dry process including chemical vapor deposition and vacuum deposition.

Figure 6:
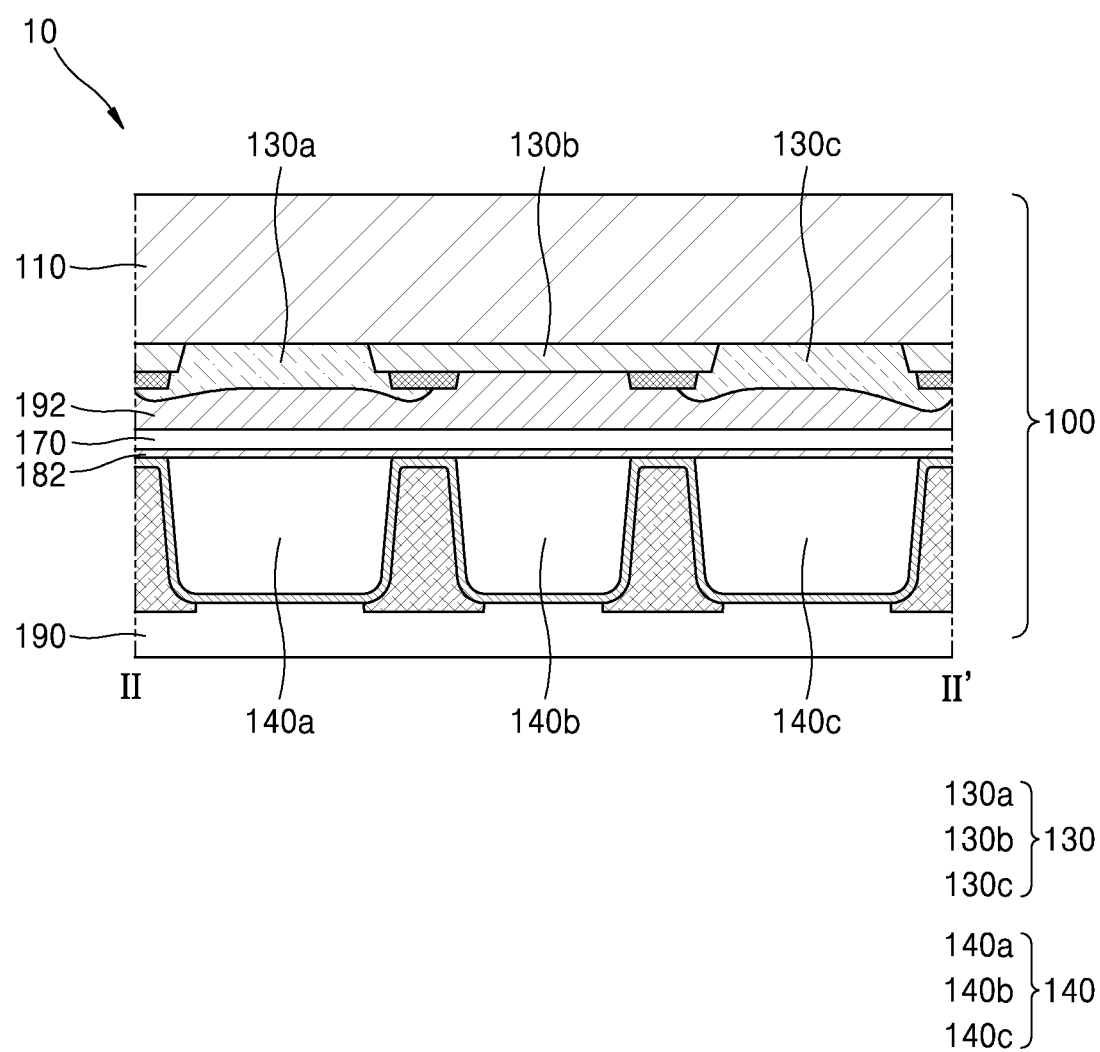
FIG. 6 is a cross-sectional view of another example of the display device, taken along line II-II' of FIG. 1.

FIG. 6 is a cross-sectional view of another example of the display device 10, taken along line II-II' of FIG. 1.

FIG. 6 shows, for convenience of description, only the optical filter 100, and the same elements as those described above are not repeatedly described for simplicity.

Referring to FIG. 6, the optical filter 100 may include the filter layer 130, the light-converting layer 140, the low refractive index layer 170, the first capping layer 182, and a buffer layer 192. The filter layer 130 is stacked on the first surface of the substrate 110. The light-converting layer 140 is over the filter layer 130. The low refractive index layer 170 is between the filter layer 130 and the light-converting layer 140. The first capping layer 182 is between the low refractive index layer 170 and the light-converting layer 140. The buffer layer 192 is between the low refractive index layer 170 and the filter layer 130.

The filter layer 130 may include the first color filter 130a, the second color filter 130b, and the third color filter 130c respectively and selectively transmitting light having different colors. The light-converting layer 140 may include the first light-converting portion 140a, the second light-converting portion 140b, and the third light-converting portion 140c respectively corresponding to the first color filter 130a, the second color filter 130b, and the third color filter 130c. A light-conversion efficiency of the first light-converting portion 140a, the second light-converting portion 140b, and the third light-converting portion 140c may be improved by the low refractive index layer 170 and the first capping layer 182.

The buffer layer 192 over the first surface of the substrate 110 may cover the first color filter 130a, the second color filter 130b, and the third color filter 130c. Since a surface of the buffer layer 192 that contacts the low refractive index layer 170 is a flat surface, the low refractive index layer 170 may be easily formed. Since the low refractive index layer 170 is made to have a uniform thickness, the total brightness of the display device 10 may be uniformly improved. For example, an average thickness of the low refractive index layer 170 may be from about 2 μm to about 3 μm. Also, the buffer layer 192 may prevent damage such as a crack from occurring in the low refractive index layer 170. For example, the buffer layer 192 may include an optically clear adhesive (OCA).

Figure 7:
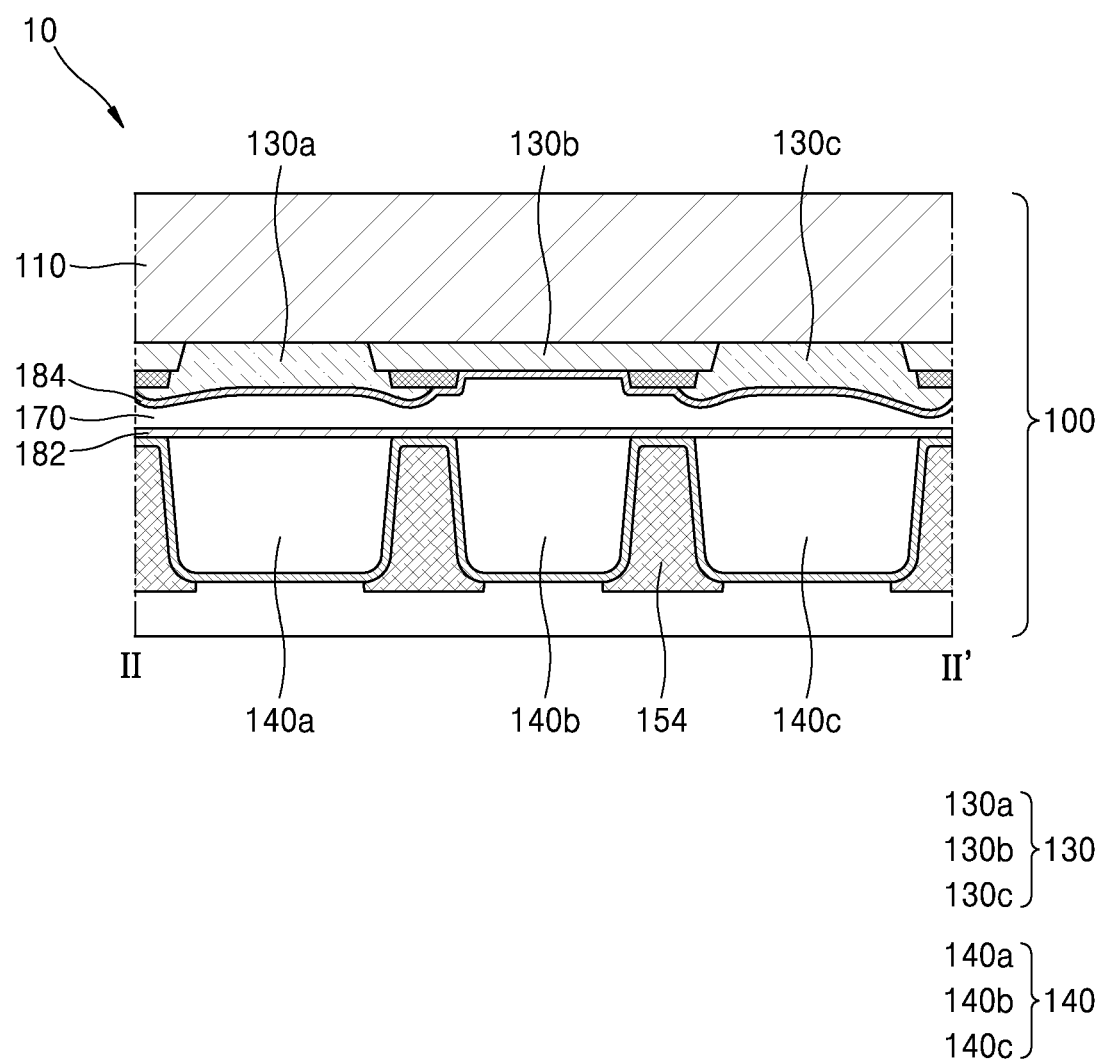
FIG. 7 is a cross-sectional view of another example of the display device, taken along line II-II' of FIG. 1.
Figure 8:
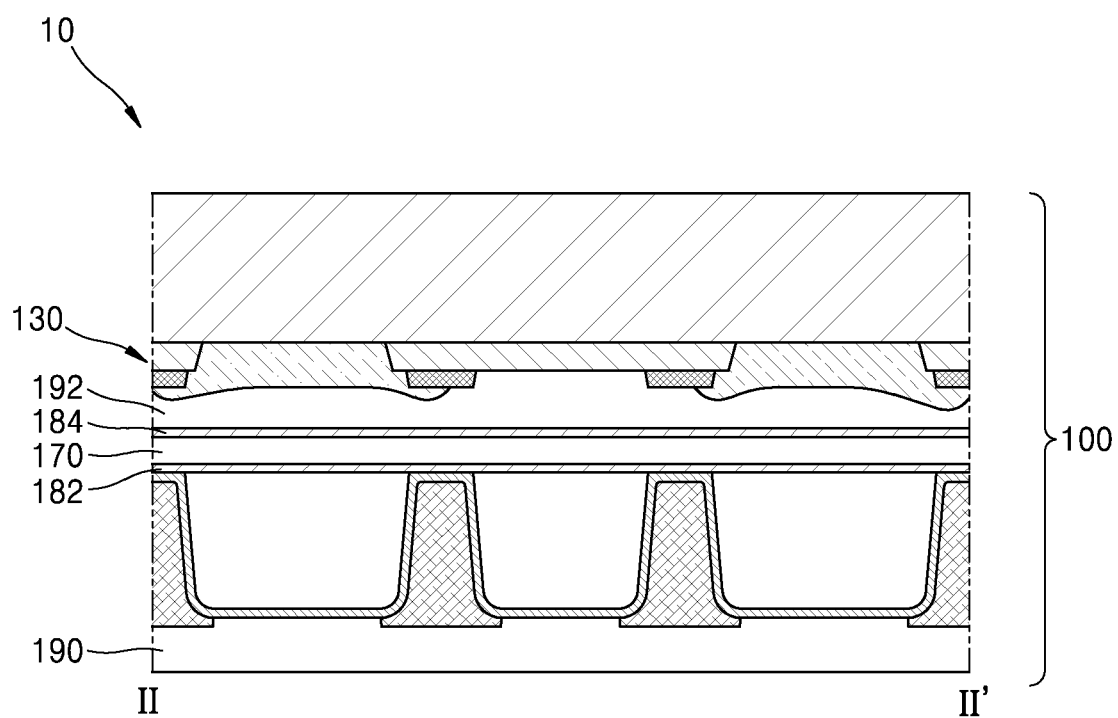
FIG. 8 is a cross-sectional view of another example of the display device taken along line II-II' of FIG. 1.

FIG. 7 is a cross-sectional view of another example of the display device 10, taken along line II-II' of FIG. 1. FIG. 8 is a cross-sectional view of another example of the display device 10, taken along line II-II' of FIG. 1.

For convenience of description, FIGS. 7 and 8 show only the optical filter 100, and the same elements as those described above are not repeatedly described for simplicity.

First, referring to FIG. 7, the optical filter 100 further includes a second capping layer 184 between the filter layer 130 and the low refractive index layer 170. The second capping layer 184 may have a refractive index between the refractive index of the low refractive index layer 170 and the refractive index of the filter layer 130. With this configuration, external light reflection at the optical filter 100 may be reduced and a display quality of the display device 10 may be improved. For example, the refractive index of the first to third color filters 130a, 130b, and 130c may be from about 1.5 to about 1.7. The refractive index of the low refractive index layer 170 may be 1.3 or less, and the refractive index of the second capping layer 184 may be from about 1.3 to about 1.5.

The second capping layer 184 may include silicon oxide or silicon oxynitride. The second capping layer 184 may protect the low refractive index layer 170 in cooperation with the first capping layer 182. The second capping layer 184 over the first surface of the substrate 110 may be formed along the bending (nonuniformity) of the first to third color filters 130a, 130b, and 130c and may have a thickness of about 1000 Å to about 4000 Å. In the case where the second capping layer 184 includes silicon nitride, it may be difficult to effectively reduce external light reflection due to a large refractive index, about 1.9, of silicon nitride.

Table 1 below shows a front total reflectivity depending on whether the second capping layer 184 is formed. In Table 1, a reflectivity represents a reflectivity at an interface between respective elements when external light is incident in a direction of the substrate 110. For example, the reflectivity of the filter layer 130 represents an external light reflectivity at an interface between the substrate 110 and the filter layer 130. Also, the only difference between the embodiment and the comparative example in Table 1 is whether the second capping layer 184 is provided.

TABLE 1

| Refractive index | Reflectivity (%, Comparative example) | Reflectivity (%, Embodiment) |
| --- | --- | --- |
| Substrate (1.5) | 4 | 4 |
| Filter layer (1.6) | 0.1 | 0.1 |
| Second capping layer (1.45) | — | 0.2 |
| Low refractive index (1.23) | 1.79 | 0.7 |
| Accumulated reflectivity (%) | 5.89 | 5 |

As known in the comparative example and the embodiment of Table 1, when the second capping layer 184 having a refractive index between the refractive index of the filter layer 130 and the refractive index of the low refractive index layer 170 is arranged between the filter layer 130 and the low refractive index layer 170, external light reflection is reduced by an increase of a critical angle, and as a result, the visibility of the display device 10 (see FIG. 1) may be improved.

As shown in FIG. 8, the buffer layer 192 may be further arranged between the second capping layer 184 and the filter layer 130. The buffer layer 192 of FIG. 8 is substantially the same as the buffer layer 192 shown and described in FIG. 6. Therefore, the second capping layer 184 is formed on a flat surface of the buffer layer 192, and the buffer layer 192 may prevent damage such as a crack from occurring in the second capping layer 184.

Figure 9:
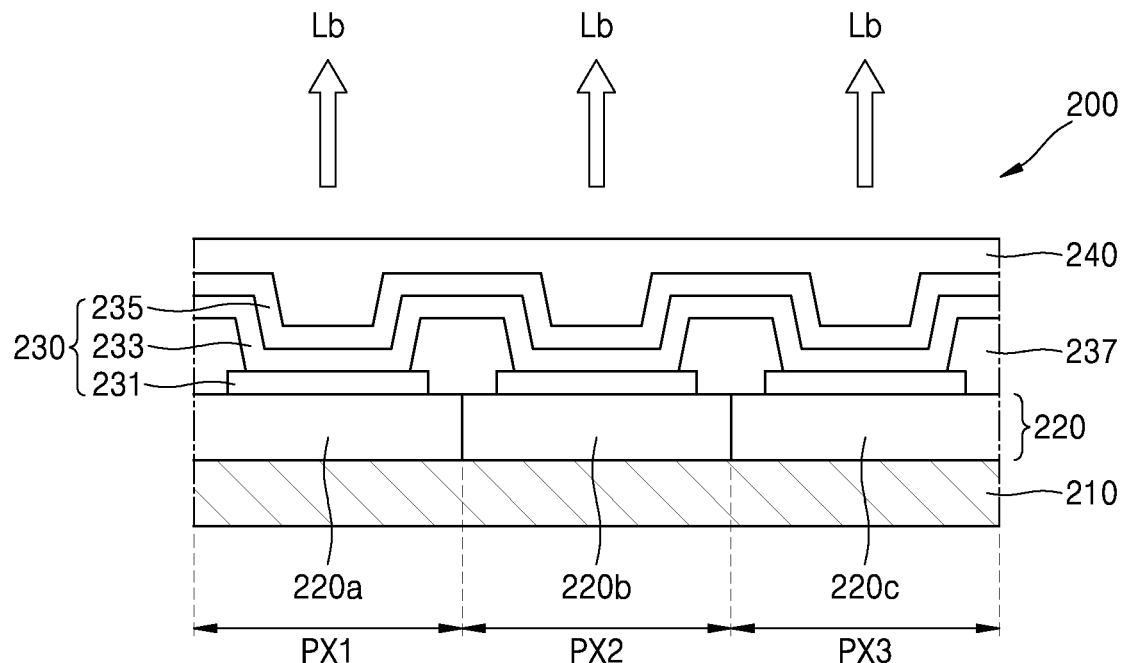
FIG. 9 is a cross-sectional view of an example of a light-emitting panel of the display device of FIG. 1.
Figure 10:
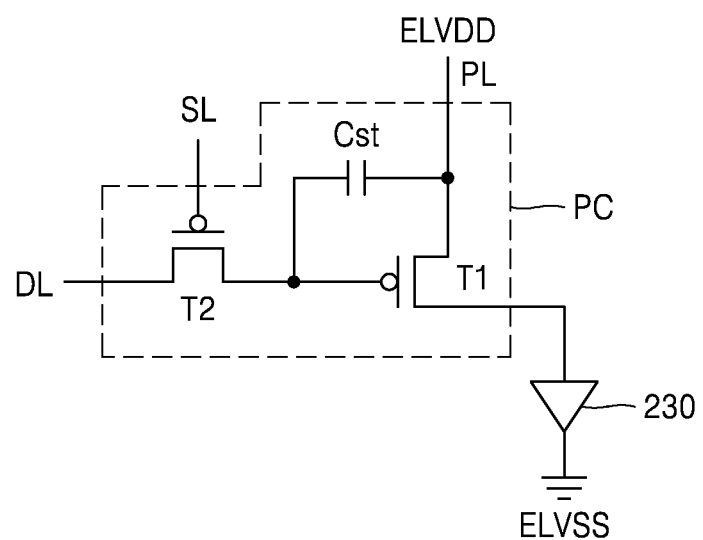
FIG. 10 is an equivalent circuit diagram of one of the pixels of the light-emitting panel of FIG. 9.

FIG. 9 is a cross-sectional view of an example of the light-emitting panel 200 of the display device of FIG. 1, and FIG. 10 is an equivalent circuit diagram of one of the pixels of the light-emitting panel 200 of FIG. 9.

Referring to FIGS. 9 and 10, the light-emitting panel 200 may include first to third pixels PX1, PX2, and PX3. The first pixel PX1 may include a light-emitting element 230 and a first pixel circuit 220a controlling the light-emitting element 230. The second pixel PX2 may include a light-emitting element 230 and a second pixel circuit 220b controlling the light-emitting element 230. The third pixel PX3 may include a light-emitting element 230 and a third pixel circuit 220c controlling the light-emitting element 230.

The light-emitting elements 230 may respectively emit light having light intensity respectively controlled by the first to third pixel circuits 220a, 220b, and 220c, for example, blue light Lb. The light-emitting element 230 is arranged to correspond to the pixel area PA (see FIG. 1) of the optical filter 100 (see FIG. 2), and blue light Lb emitted from the light-emitting element 230 becomes the incident light Lib (see FIG. 2) incident to the optical filter 100 (see FIG. 2).

For example, blue light Lb emitted from the light-emitting element 230 controlled by the first pixel circuit 220a of the first pixel PX1 is converted to light having the first color by the first light-converting portion 140a (see FIG. 2) and emitted to the outside through the substrate 110 (see FIG. 2). Blue light Lb emitted from the light-emitting element 230 controlled by the second pixel circuit 220b of the second pixel PX2 may be emitted to the outside through the substrate 110 (see FIG. 2) without color conversion through the second light-converting portion 140b (see FIG. 2). Also, blue light Lb emitted from the light-emitting element 230 controlled by the third pixel circuit 220c of the third pixel PX3 is converted to light having the third color by the third light-converting portion 140c (see FIG. 2) and emitted to the outside through the substrate 110 (see FIG. 2). Therefore, since blue light Lb emitted from the light-emitting panel 200 is converted into red light, blue light, and green light while passing through the optical filter 100 (see FIG. 2), a color image is displayed.

Each of the first to third pixel circuits 220a, 220b, and 220c is arranged in a pixel circuit layer 220, which is a bottom layer of the light-emitting element 230, and may or may not overlap at least a portion of the light-emitting element 230.

As shown in FIG. 10, each of the first to third pixel circuits 220a, 220b, and 220c may include first and second thin film transistors T1 and T2, a storage capacitor Cst, and wirings electrically connected to the first to third pixel circuits 220a, 220b, and 220c. However, this is provided as an example, and the first to third pixel circuits 220a, 220b, and 220c may include various configurations.

The second thin film transistor T2 is a switching thin film transistor, is connected to a scan line SL and a data line DL, and may be configured to transfer a data voltage input from the data line DL to the first thin film transistor T1 in response to a switching voltage input from the scan line SL. The storage capacitor Cst may be connected to the second thin film transistor T2 and a driving voltage line PL and may be configured to store a voltage corresponding to a difference between a voltage transferred from the second thin film transistor T2 and a first power voltage ELVDD supplied to the driving voltage line PL. The first thin film transistor T1 is a driving thin film transistor, is connected to the driving voltage line PL and the storage capacitor Cst, and may be configured to control a driving current flowing through the light-emitting element 230 from the driving voltage line PL in response to the voltage stored in the storage capacitor Cst.

Paying particular attention now to FIGS. 9 and 10 together, the light-emitting element 230 may emit light having a predetermined brightness according to the driving current. The light-emitting element 230 may include a pixel electrode 231, an intermediate layer 233, and an opposite electrode 235. The opposite electrode 235 of the light-emitting element 230 may receive a second power voltage ELVSS. The light-emitting element 230 may include, for example, an organic light-emitting diode.

The pixel electrode 231 may be electrically connected to a source electrode or a drain electrode of a thin film transistor. The pixel electrode 231 may be exposed through an opening of a pixel-defining layer 237, and edges of the pixel electrode 231 may be covered by the pixel-defining layer 237.

The intermediate layer 233 may be arranged on a portion of the pixel electrodes 231 that is exposed by the pixel-defining layer 237. The intermediate layer 233 may include an organic emission layer, and the organic emission layer may include a low molecular weight organic material or a polymer organic material. The intermediate layer 233 may selectively further include a functional layer such as a hole transport layer (HTL), a hole injection layer (HIL), an electron transport layer (ETL), and an electron injection layer (EIL) in addition to the organic emission layer. The intermediate layer 233 may be provided as one body over the first to third pixels PX1, PX2, and PX3.

The opposite electrode 235 may be arranged to cover the intermediate layer 233 and the pixel-defining layer 237. The opposite electrode 235 may include a transparent or semi-transparent electrode. For example, the opposite electrode 235 may include a metal thin film having a small work function. The opposite electrode 235 may include a transparent conductive oxide (TCO). The opposite electrode 235 may be provided as one body over the first to third pixels PX1, PX2, and PX3.

An encapsulation layer 240 may be arranged on the light-emitting element 230. The encapsulation layer 240 may cover the opposite electrode 235 and be arranged on an entire surface of a base substrate 210. The encapsulation layer 240 may include an inorganic encapsulation layer including at least one inorganic material and an organic encapsulation layer including at least one organic material. In an embodiment, the encapsulation layer 240 may have a structure in which a first inorganic encapsulation layer/an organic encapsulation layer/a second inorganic encapsulation layer are stacked.

Figure 11:
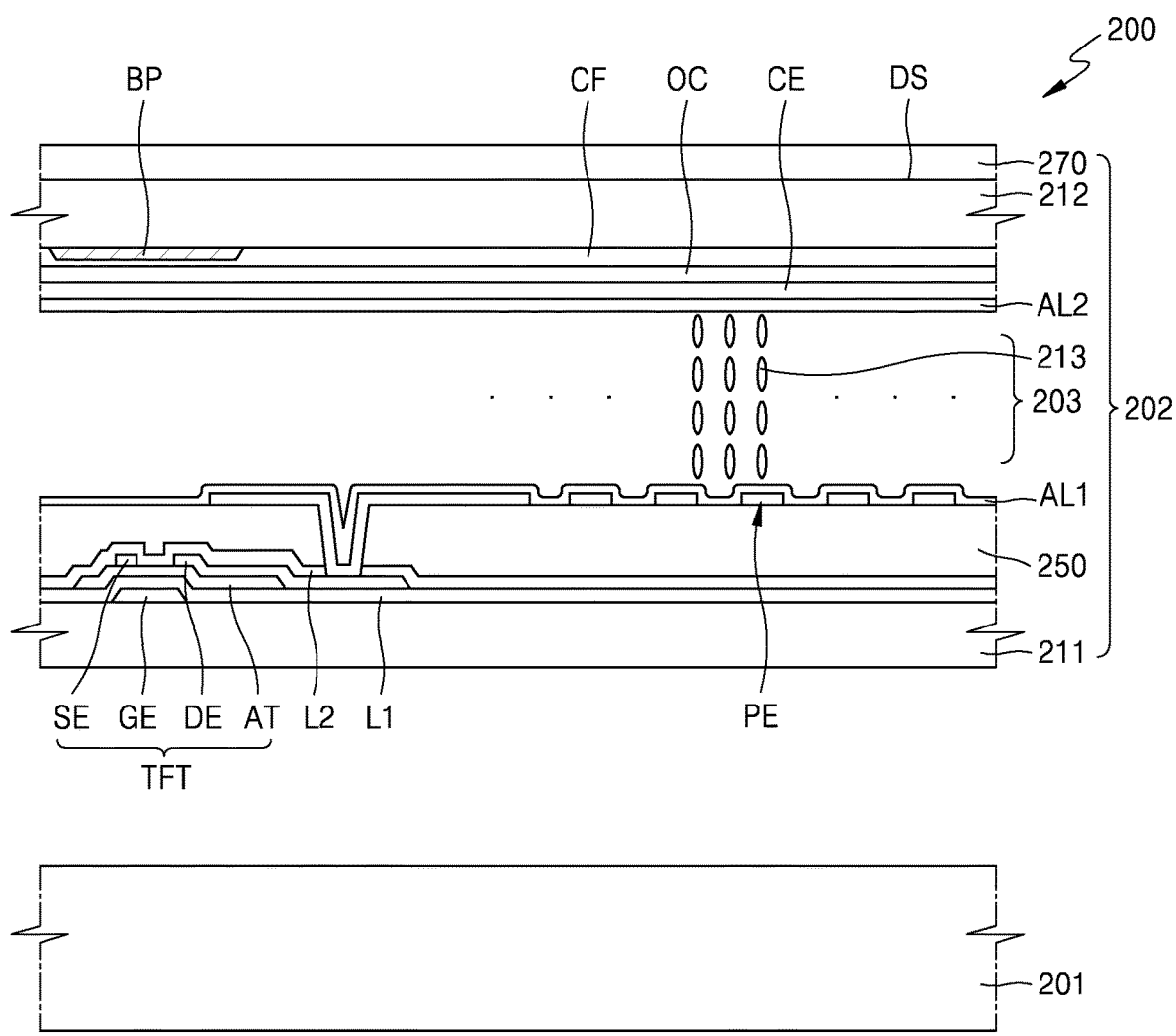
FIG. 11 is a cross-sectional view of another example of the light-emitting panel of the display device of FIG. 1.

FIG. 11 is a cross-sectional view of another example of the light-emitting panel 200 of FIG. 2.

Referring to FIG. 11, the light-emitting panel 200 may include a backlight unit 201 and a display element layer 202 over the backlight unit 201. The backlight unit 201 generates light.

For example, the backlight unit 201 may include a light source and a light guide plate. The light source generates light having a specific wavelength. The light guide plate guides light generated from the light source to the display element layer 202. The light source may include, for example, a light-emitting diode (LED), an organic light-emitting diode (OLED). Light generated by the light source may be blue light incident to the optical filter 100 (see FIG. 2).

The display element layer 202 may include a first substrate 211, a liquid crystal layer 203, a pixel electrode PE, and a common electrode CE. The liquid crystal layer 203 is located over the first substrate 211 and includes liquid crystal molecules 213. The pixel electrode PE and the common electrode CE apply an electric field to the liquid crystal layer 203. Also, the light-emitting panel 200 may include a second substrate 212 facing the first substrate 211.

A thin film transistor (TFT) array layer, the pixel electrode PE, and a first alignment layer AL1 may be arranged on the first substrate 211.

The first substrate 211 may include a plastic substrate including polyethylene terephthalate (PET), polyethylene naphthalate (PEN), polyimide as well as a glass substrate.

The TFT array layer includes a switching element (e.g. a TFT) and also includes gate lines and data lines (not shown). The switching element is a TFT and includes an active layer AT, a gate electrode GE, a source electrode SE, and a drain electrode DE.

A first insulating layer L1, which is a gate insulating layer, is formed on the gate electrode GE. The active layer AT is formed on the first insulating layer L1. The gate electrode GE is apart from the source electrode SE on the active layer AT. A second insulating layer L2 covers the drain electrode DE and the source electrode SE. FIG. 11 shows, as an example, a bottom gate type-thin film transistor in which the gate electrode GE is located below the active layer AT, although various types of thin film transistors such as a top gate type-thin film transistor in which the gate electrode GE is located over the active layer AT may be employed.

The active layer AT may include various materials. For example, the active layer AT may include an inorganic semiconductor material such as amorphous silicon or crystalline silicon. As another example, the active layer AT may include an oxide semiconductor. As another example, the active layer AT may include an organic semiconductor material.

The gate electrode GE, the source electrode SE, and the drain electrode DE may include a single layer or a multi-layer including at least one metal among aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu).

The first insulating layer L1 and the second insulating layer L2 may include various kinds of insulating materials. The first insulating layer L1 and the second insulating layer L2 may include a single layer or a multi-layer including at least one of $SiO_2$, $SiN_x$, SiON, $Al_2O_3$, $TiO_2$, $Ta_2O_5$, $HfO_2$, $ZrO_2$, BST, and PZT.

A planarization layer 250 may be further arranged over the TFT array layer, and the pixel electrode PE may be arranged on the planarization layer 250. The pixel electrode PE passes through the planarization layer 250 and the second insulating layer L2 and is connected to the drain electrode DE of the switching element TFT. The first alignment layer AL1 may be formed on the pixel electrode PE. The first alignment layer AL1 aligns the liquid crystal molecules 213.

A light-blocking pattern BP, a color filter CF, an overcoat layer OC, and the common electrode CE are formed on the second substrate 212. Also, a second alignment layer AL2 may be formed on the common electrode CE. The second alignment layer AL2 aligns the liquid crystal molecules 213.

The second substrate 212 may include a glass substrate or a transparent plastic substrate, and an outer surface of the second substrate 212 becomes a display surface DS.

The light-blocking pattern BP is arranged on a location of the second substrate 212 corresponding to an area in which the switching element TFT, the gate lines and the data lines (not shown) are formed. The light-blocking pattern BP blocks light. A location of the light-blocking pattern BP is shown as an example, and the light-blocking pattern BP may be arranged on the first substrate 211.

The color filter CF is arranged on the second substrate 212 and filters color light. The configuration of the color filter CF is provided as an example, and the color filter CF may be arranged on the first substrate 211.

The overcoat layer OC is arranged on the second substrate 212 on which the color filter CF is formed and planarizes a top surface of the second substrate 212. The overcoat layer OC may be omitted.

The common electrode CE is arranged over the second substrate 212 to face the pixel electrode PE. A reference voltage, that is, a common voltage, is applied to the common electrode CE, the reference voltage defining polarity of a voltage applied to the pixel electrode PE. For example, the common electrode CE may have a flat plate shape.

The liquid crystal layer 203 includes the liquid crystal molecules 213. Though it is shown in FIG. 11 that the liquid crystal layer 203 is a vertical alignment mode liquid crystal layer, in an embodiment, the liquid crystal molecules 213 may be aligned in a horizontal direction and twisted by 90° between the pixel electrode PE and the common electrode CE.

When a voltage is applied between the pixel electrode PE and the common electrode CE, an electric field is applied to the liquid crystal layer 203. The electric field may change the alignment of the liquid crystal molecules 213 and adjust an amount of light, or light intensity, passing through the liquid crystal layer 203, and thus the light-emitting panel 200 may generate light.

A polarization layer 270 may be located on the display surface DS of the second substrate 212. As another example, the polarization layer 270 may be formed on a flat surface of the overcoat layer 190 of the optical filter 100 (see FIG. 2). The polarization layer 270 may allow light generated by the light-emitting panel 200 to be polarized and be incident to the optical filter 100 (see FIG. 2). When the polarization layer 270 is located on a second surface of the substrate 110, the polarization layer 270 polarizes light that passes through the optical filter 100 (see FIG. 2). In this case, since scattering of the light occurs while the light passes through the optical filter 100 (see FIG. 2), it is difficult to generate accurately polarized light by using the polarization layer 270. Therefore, the polarization layer 270 should be located between the light-emitting panel 200 and the optical filter 100 (see FIG. 2).

According to an embodiment, since the low refractive index layer is arranged between the filter layer and the light-converting layer of the optical filter, and the first capping layer is arranged between the low refractive index layer and the light-converting layer, the first capping layer having a refractive index between a refractive index of the low refractive index layer and a refractive index of the light-converting layer, a light-conversion efficiency of the optical filter may be improved.

Also, since the second capping layer is arranged between the filter layer and the low refractive index layer, the second capping layer having a refractive index between a refractive index of the filter layer and a refractive index of the low refractive index layer, external light reflection is reduced and thus the display device may have an excellent display quality.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made without departing from the spirit and scope as defined by the following claims.

What is claimed is:

1. An optical filter comprising:
   a substrate;
   a filter layer on the substrate and including color filters;
   a light-converting layer over the filter layer and including light-converting portions respectively corresponding to the color filters;
   a low refractive index layer between the filter layer and the light-converting layer and having a refractive index less than a refractive index of the light-converting layer;
   a first capping layer between the low refractive index layer and the light-converting layer and having a refractive index between the refractive index of the light-converting layer and the refractive index of the low refractive index layer;
   pixel areas apart from each other; and
   a light-blocking area between the pixel areas,
   wherein the color filters correspond to the pixel areas, and two neighboring color filters among the color filters partially overlap each other in the light-blocking area, wherein a first light-blocking pattern is located in the light-blocking area, and one of the color filters is located between the first light-blocking pattern and the substrate.

2. The optical filter of claim 1, further comprising a buffer layer covering the filter layer between the filter layer and the low refractive index layer.

3. An optical filter comprising:
   a substrate;
   a filter layer on the substrate and including color filters;
   a light-converting layer over the filter layer and including light-converting portions respectively corresponding to the color filters;
   a low refractive index layer between the filter layer and the light-converting layer and having a refractive index less than a refractive index of the light-converting layer;
   a first capping layer between the low refractive index layer and the light-converting layer and having a refractive index between the refractive index of the light-converting layer and the refractive index of the low refractive index layer; and
   a second capping layer between the filter layer and the low refractive index layer, wherein a refractive index of the second capping layer is less than a refractive index of the filter layer and greater than the refractive index of the low refractive index layer.

4. The optical filter of claim 3, further comprising a buffer layer covering the filter layer between the filter layer and the second capping layer.

5. The optical filter of claim 1, wherein the light-converting portions include a first light-converting portion, a second light-converting portion, and a third light-converting portion each including scattering particles,
   the first light-converting portion including first quantum dots, and the third light-converting portion including third quantum dots, and
   the first quantum dots and the third quantum dots include a same material and have different sizes.

6. The optical filter of claim 1, further comprising a barrier layer covering the light-converting portions,
   wherein the light-converting portions are apart from each other, and the barrier layer directly contacts the first capping layer in the light-blocking area.

7. The optical filter of claim 6, further comprising a second light-blocking pattern located between the light-converting portions that are apart from each other.

8. The optical filter of claim 7, further comprising an overcoat layer providing a flat surface by covering the light-converting portions.

9. A display device comprising:
   a light-emitting panel that emits incident light having a single color; and
   an optical filter including pixel areas and a light-blocking area between the pixel areas and converting the incident light into converted light having different colors to emit the converted light from the pixel areas to the outside, wherein the optical filter includes:

a substrate;

a filter layer on the substrate and including color filters, wherein the color filters correspond to the pixel areas, and two neighboring color filters among the color filters partially overlap each other in the light-blocking area;

a light-converting layer over the filter layer and including light-converting portions respectively corresponding to the color filters;

a low refractive index layer between the filter layer and the light-converting layer;

a first capping layer between the low refractive index layer and the light-converting layer, wherein a refractive index of the first capping layer is greater than a refractive index of the low refractive index layer and less than a refractive index of the light-converting layer; and a first light-blocking pattern located in the light-blocking area, and one of the color filters is located between the first light-blocking pattern and the substrate.

10. The display device of claim 9, wherein the light-emitting panel includes light-emitting elements that generate the incident light having the single color, and the light-emitting elements respectively correspond to the pixel areas.

11. The display device of claim 9, further comprising a buffer layer covering the filter layer between the filter layer and the low refractive index layer.

12. A display device comprising:

a light-emitting panel that emits incident light having a single color; and an optical filter including pixel areas and a light-blocking area between the pixel areas and converting the incident light into converted light having different colors to emit the converted light from the pixel areas to the outside, wherein the optical filter includes:

a substrate;

a filter layer on the substrate and including color filters;

a light-converting layer over the filter layer and including light-converting portions respectively corresponding to the color filters;

a low refractive index layer between the filter layer and the light-converting layer;

a first capping layer between the low refractive index layer and the light-converting layer, wherein a refractive index of the first capping layer is greater than a refractive index of the low refractive index layer and less than a refractive index of the light-converting layer; and a second capping layer between the filter layer and the low refractive index layer, wherein a refractive index of the second capping layer is less than a refractive index of the filter layer and greater than a refractive index of the low refractive index layer.

13. The display device of claim 12, further comprising a buffer layer covering the filter layer between the filter layer and the second capping layer.

14. The display device of claim 9, further comprising a barrier layer covering the light-converting portions, wherein the light-converting portions are apart from each other, and the barrier layer directly contacts the first capping layer in the light-blocking area.

15. The display device of claim 14, further comprising a second light-blocking pattern located between the light-converting portions that are apart from each other.

16. The display device of claim 9, wherein the light-emitting panel includes a liquid crystal layer including liquid crystal molecules, the optical filter further includes an overcoat layer providing a flat surface by covering the light-converting portions, and the display device further includes a polarization layer between the light-emitting panel and the overcoat layer.

* * * * *